(12) United States Patent
Nakajima et al.

(10) Patent No.: US 10,087,016 B2
(45) Date of Patent: Oct. 2, 2018

(54) ARTICLE SUPPLY DEVICE

(71) Applicant: KURASHIKI BOSEKI KABUSHIKI KAISHA, Okayama (JP)

(72) Inventors: Daisuke Nakajima, Osaka (JP); Hideaki Hikawa, Osaka (JP)

(73) Assignee: KURASHIKI BOSEKI KABUSHIKI KAISHA, Okayama (JP)

( * ) Notice: Subject to any disclaimer, the term of this patent is extended or adjusted under 35 U.S.C. 154(b) by 0 days.

(21) Appl. No.: 15/555,553

(22) PCT Filed: Mar. 1, 2016

(86) PCT No.: PCT/JP2016/056179
§ 371 (c)(1),
(2) Date: Sep. 5, 2017

(87) PCT Pub. No.: WO2016/143597
PCT Pub. Date: Sep. 15, 2016

(65) Prior Publication Data
US 2018/0037418 A1   Feb. 8, 2018

(30) Foreign Application Priority Data

Mar. 6, 2015 (JP) .................................. 2015-045299
Dec. 28, 2015 (JP) .................................. 2015-257375

(51) Int. Cl.
*B65G 47/00* (2006.01)
*B65G 47/14* (2006.01)
(Continued)

(52) U.S. Cl.
CPC ......... *B65G 47/1407* (2013.01); *B65G 47/14* (2013.01); *H05K 13/02* (2013.01); *H05K 13/0417* (2013.01)

(58) Field of Classification Search
CPC .................. B65G 47/1485; H05K 13/027
(Continued)

(56) References Cited

U.S. PATENT DOCUMENTS 2,842,923 A * 7/1958 Kjellsen .................. H01J 9/46
141/8
2,993,737 A * 7/1961 Stephen .................. B07C 5/02
406/34
(Continued)

FOREIGN PATENT DOCUMENTS

JP   S54155578   12/1979
JP   S61291317   12/1986
(Continued)

OTHER PUBLICATIONS

"International Search Report (Form PCT/ISA/210) of PCT/JP2016/056179", dated May 31, 2016, with English translation thereof, pp. 1-3.

Primary Examiner — Joseph A Dillon, Jr.
(74) Attorney, Agent, or Firm — JCIPRNET

(57) ABSTRACT

An article supply device has: a transport part that transports transported objects, and a movable block. The movable block is provided with a storage part that can store one of the transported objects in a reception position that communicates with a downstream end of the transport part. The movable block is capable of reciprocal movement in a direction that intersects the reception direction of the transported object. At one end of the reciprocal movement, the storage part is in the reception position. At the other end of the reciprocal movement, the storage part is in a dispensation or retrieval position from which the transported object can be dispensed or retrieved.

11 Claims, 14 Drawing Sheets

(51) Int. Cl.
*H05K 13/02* (2006.01)
*H05K 13/04* (2006.01)

(58) Field of Classification Search
USPC .............................. 406/180, 192; 221/278
See application file for complete search history.

(56) References Cited

U.S. PATENT DOCUMENTS

| | | | | |
|---|---|---|---|---|
| 4,101,054 A * | 7/1978 | Frost | B23P 19/003 | 221/225 |
| 4,275,976 A * | 6/1981 | Sticht | B65G 51/38 | 406/148 |
| 4,363,573 A * | 12/1982 | Ginther | B65G 51/02 | 221/278 |
| 4,741,428 A * | 5/1988 | Taniguchi | B07C 5/02 | 111/77 |
| 4,801,044 A * | 1/1989 | Kubota | B65G 47/1407 | 221/163 |
| 4,815,583 A * | 3/1989 | Le Corre | B65G 15/58 | 198/396 |
| 4,828,142 A * | 5/1989 | McKnight | A61J 3/074 | 221/171 |
| 4,896,792 A * | 1/1990 | Marchand | G07F 11/10 | 221/103 |
| 4,953,749 A * | 9/1990 | Kubota | B65G 47/1407 | 221/168 |
| 5,152,390 A * | 10/1992 | Kubota | B65G 47/848 | 198/463.4 |
| 5,853,108 A * | 12/1998 | Ando | H05K 13/02 | 221/112 |
| 6,041,964 A * | 3/2000 | Tokarz | B23Q 7/106 | 221/211 |
| 6,116,822 A * | 9/2000 | Teoh | B65G 47/1407 | 198/468.2 |
| 6,119,893 A * | 9/2000 | Mueller | H05K 13/0434 | 221/211 |
| 6,135,264 A * | 10/2000 | Saito | H05K 13/028 | 198/383 |
| 6,210,079 B1 * | 4/2001 | Teoh | B23P 19/005 | 406/12 |
| 6,210,081 B1 * | 4/2001 | Saho | B23P 19/004 | 198/533 |
| 6,318,541 B1 * | 11/2001 | Takahashi | B65G 25/06 | 198/750.1 |
| 6,390,736 B2 * | 5/2002 | Rassman, Jr. | B65G 47/248 | 406/177 |
| 6,443,326 B1 * | 9/2002 | Saito | B23P 19/001 | 221/163 |
| 6,443,669 B2 * | 9/2002 | Saito | H05K 13/021 | 198/390 |
| 6,484,902 B1 * | 11/2002 | Rouse | B65D 88/70 | 221/278 |
| 6,540,065 B2 * | 4/2003 | Kurabe | B65G 47/1485 | 198/471.1 |
| 6,575,347 B2 * | 6/2003 | Coonrod | B21J 15/32 | 227/112 |
| 6,588,576 B1 * | 7/2003 | Roessler | B21J 15/32 | 198/374 |
| 6,666,626 B2 * | 12/2003 | McMahon | B65G 47/1421 | 400/176 |
| 6,726,408 B2 * | 4/2004 | McMahon | A44B 19/267 | 406/176 |
| 6,752,291 B2 * | 6/2004 | Saito | H05K 13/021 | 221/164 |
| 6,869,264 B2 * | 3/2005 | Yoo | H01L 21/67132 | 198/493 |
| 6,904,656 B2 * | 6/2005 | McMahon | B65G 47/1421 | 29/33.2 |
| 6,932,544 B2 * | 8/2005 | McMahon | A44B 19/267 | 406/156 |
| 7,104,394 B2 * | 9/2006 | Baird | B65G 27/24 | 198/766 |
| 7,284,934 B2 * | 10/2007 | Hoogers | H05K 13/021 | 221/278 |
| 7,326,005 B1 * | 2/2008 | Castro | B65G 51/22 | 406/19 |
| 7,331,442 B2 * | 2/2008 | Saito | B65G 47/145 | 198/389 |
| 7,837,027 B2 * | 11/2010 | Takeuchi | H01L 21/67784 | 198/493 |
| 8,033,382 B2 * | 10/2011 | Sasaoka | H05K 13/021 | 198/393 |
| 8,292,549 B2 * | 10/2012 | Iida | B65G 49/065 | 406/88 |
| 8,584,830 B2 * | 11/2013 | Heigl | H05K 13/021 | 198/471.1 |
| 8,800,747 B2 * | 8/2014 | Pedrazzini | B65G 47/1471 | 198/397.06 |
| 9,051,133 B2 * | 6/2015 | Kremser | B65G 51/02 | |
| 9,174,812 B2 * | 11/2015 | Harris | B65G 53/34 | |
| 9,233,804 B2 * | 1/2016 | Pedrazzini | B65G 47/1471 | |
| 9,459,183 B1 * | 10/2016 | Schnakenberg | G01N 1/04 | |
| 9,533,839 B2 * | 1/2017 | Nierescher | B65G 53/14 | |
| 9,617,086 B2 * | 4/2017 | Rusterholz | B65G 53/525 | |
| 9,688,485 B2 * | 6/2017 | Sorensen | B65G 51/02 | |
| 2002/0050443 A1 * | 5/2002 | Kurabe | B65G 47/1485 | 198/803.5 |
| 2006/0280564 A1 * | 12/2006 | Hoogers | H05K 13/027 | 406/197 |
| 2008/0217136 A1 * | 9/2008 | Ikeda | B65G 47/1457 | 198/380 |
| 2011/0005895 A1 | 1/2011 | Kim et al. | | |
| 2017/0369244 A1 * | 12/2017 | Battles | B65G 1/137 | |

FOREIGN PATENT DOCUMENTS

| | | |
|---|---|---|
| JP | H06115669 | 4/1994 |
| JP | H10294597 | 11/1998 |
| JP | 2002190694 | 7/2002 |
| JP | 2013001541 | 1/2013 |

* cited by examiner

ARTICLE SUPPLY DEVICE

CROSS-REFERENCE TO RELATED APPLICATION

This application is a 371 application of the International PCT application serial no. PCT/JP2016/056179, filed on Mar. 1, 2016, which claims priority benefits of Japan Patent Application No. 2015-045299 filed on Mar. 6, 2015 and Japan Patent Application No. 2015-257375 filed on Dec. 28, 2015. The entirety of the above-mentioned patent applications is hereby incorporated by reference herein and made a part of this specification.

FIELD OF THE INVENTION

The present invention relates to a device that conveys and supplies minute articles.

BACKGROUND OF THE INVENTION

A tape-reel feeder has been used to supply electronic components to be mounted on a print board. The tape-reel feeder is a device that forms dimples on a tape made of synthetic resin or paper at intervals of 1 to 2 mm, houses electronic components in the dimples, and supplies the electronic components to a mounting device (mounter). However, the tape-reel feeder has problems in that its size becomes large due to bulkiness of the tape, and the tape become a waste product after its usage.

To address this problem, a bulk feeder has been developed that uses no tape. In the bulk feeder, electronic components are thrown in a hopper, introduced in a conveyance path having a tunnel shape from a lower portion of the hopper, aligned in line, and conveyed and supplied to a mounter by an air flow. The electronic components that have reached a take-out port provided at a conveyance path end are sucked by a pickup nozzle of the mounter to be sequentially taken out. For example, Patent Literature 1 describes a bulk feeder that sends rectangular chips randomly housed in a cassette into a tunnel and conveys the chips by vacuum suction from an end side (downstream side) of the tunnel.

A solder ball is used to electrically connect an electronic component such as a ball grid array (BGA) semiconductor package and a mounting substrate. To align solder balls, an array board has been conventionally used in which a number of holes each for housing one solder ball are arranged. For example, solder balls can be aligned by dropping a number of solder balls on the array board and rubbing an upper portion of the array board with a squeegee made of a rubber to make solder balls enter the holes and remove the redundant solder balls.

In this context, in the conventional method using the array board, a solder ball can be nipped between the squeegee and an edge of the hole, causing chipping or cracking. In this case, electrical conduction properties are disadvantageously changed due to reduction of the volume of the solder ball. To address this problem, too, solder balls may be supplied one by one using a bulk feeder or the like.

CITATION LIST

Patent Literature

Patent Literature 1: JP-A-10-294597

SUMMARY OF INVENTION

Problem to be Solved by the Invention

However, studies by the present inventors have revealed that the conventional bulk feeder has a problem in improving supply speed. Reducing a take-out time interval (pitch) by the pickup nozzle of the mounter increases the probability of failure in taking out the conveyed object. The reason of the problem is not in slow speed of the conveyance itself but in the interference of the subsequent conveyed object with the conveyed object to be taken out from a downstream end of the conveyance path. That is, the studies have shown that the conveyed objects aligned and conveyed in the conveyance path reach the downstream end one after another to form a line without gaps, causing the leading one conveyed object to be interrupted by the subsequent conveyed object when the leading one conveyed object is taken out.

The present invention has been conceived in consideration of the above problems, and an object thereof is to provide a supply device capable of conveying minute articles and supplying the conveyed minute articles one by one at a high speed.

Means for Solving Problem

To achieve the above object, a supply device of the present invention separates only a leading conveyed object at a downstream end of a conveyance portion and moves the leading conveyed object in a side direction.

An article supply device of the present invention has a conveyance portion for conveying conveyed objects, and a movable block. The movable block includes a housing portion capable of housing one of the conveyed objects at a receiving position in which the housing portion communicates with a downstream end of the conveyance portion. Moreover, the movable block is capable of a reciprocal movement in a direction intersecting a receiving direction of the conveyed objects, and the housing portion is in the receiving position at one end of the reciprocal movement, and the housing portion is at a dispensing position or a take-out position in which the conveyed objects can be dispensed or taken out at another end of the reciprocal movement.

Preferably, the article supply device further has pressurization/depressurization portions at both ends of a movable area of the movable block, and the movable block is capable of the reciprocal movement by a pressure difference caused by the pressurization/depressurization portions.

Preferably, the movable block further has a positioning mechanism, and the positioning mechanism is capable of positioning within, the housing portion, the conveyed objects housed in the housing portion.

The positioning mechanism may position the conveyed objects on a side wall surface of the housing portion. In this case, the positioning mechanism is preferably a vent portion for fixation communicating with a depressurization portion, and has an opening on the side wall surface of the housing portion. More preferably, the movable block further has a positioning mechanism for positioning the conveyed objects housed in the housing portion on the side wall surface of the housing portion, and the positioning mechanism is a vent portion for fixation communicating with one of the pressurization/depressurization portions on a side of the dispensing position or the take-out position, and has an opening on the side wall surface of the housing portion wall surface on a side of the dispensing position or the take-out position.

When the positioning mechanism positions the conveyed objects on the side wall surface of the housing portion, a sum (D+G) of a length (D) of the housing portion in a conveying direction of the conveyed objects and a gap (G) between the housing portion and the conveyance portion downstream end is preferably longer than a standard length ($L_S$) of the conveyed objects in the conveying direction.

The positioning mechanism may position the conveyed objects on a bottom face of the housing portion. In this case, the positioning mechanism is preferably a vent portion for fixation communicating with a depressurization portion, and has an opening on the bottom face of the housing portion. More preferably, the movable block further has a positioning mechanism for positioning the conveyed objects housed in the housing portion on the bottom face of the housing portion, and the positioning mechanism is a vent portion for fixation communicating with one of the pressurization/depressurization portions on a side of the dispensing position or the take-out position, and has an opening on the bottom face of the housing portion.

When the positioning mechanism positions the conveyed objects on the side wall surface of the housing portion, the opening preferably has a round shape, and more preferably, the vent portion for fixation has a radius that becomes smaller as it goes inward from the opening in the vicinity of the opening.

In each of the above article supply devices, the conveyance portion may be a first conveyance path extending in a one-dimensional direction.

Furthermore, each of the above article supply devices may further have a take-out port that enables the conveyed objects in the housing to be taken out when the movable block is at the other end of the reciprocal movement and the housing portion is at the take-out position. Alternatively, each of the above article supply devices may further have a second conveyance path provided in the movable block on a side opposite to the conveyance portion and extending in a one-dimensional direction, and the conveyed objects in the housing portion may be dispensable on an upstream end of the second conveyance path when the movable block is at the other end of the of the reciprocal movement and the housing portion is in the dispensing position.

EFFECT OF THE INVENTION

The article supply device of the present invention makes it possible to separate, at a high speed by the movable block, only the leading one conveyed object from a line of the conveyed objects that have reached the downstream end of the conveyance portion. The conveyed object separated in this manner can be taken out by a pickup nozzle without interference with the subsequent conveyed object or introduced to another conveyance path with synchronization.

DESCRIPTION OF EMBODIMENTS

An article supply device according to a first embodiment of the present invention will be described with reference to FIG. 1 to FIG. 8. Note that in each diagram for the present specification, its reduction scale is incorrect and a gap between members and the like are exaggerated for easy description.

Figure 1:
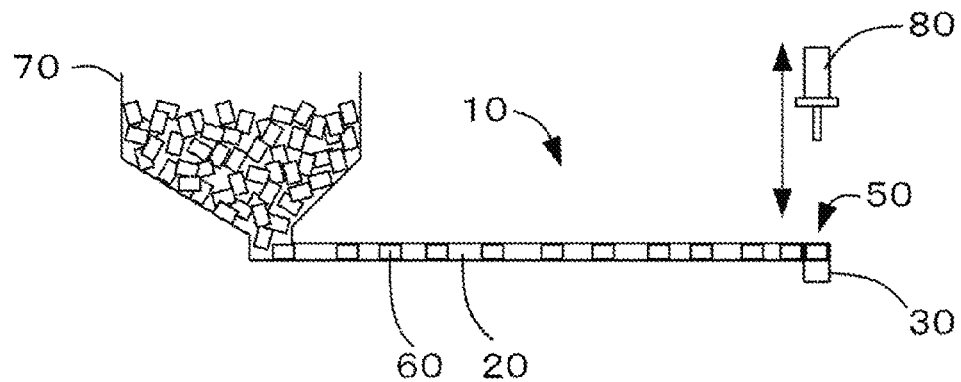
FIG. 1 is a side view illustrating a usage state of an article supply device according to a first embodiment of the present invention.
Figure 2:
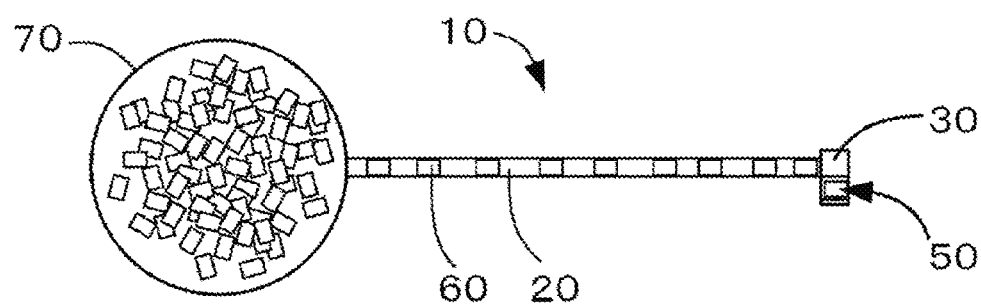
FIG. 2 is a plan view illustrating the usage state of the article supply device according to the first embodiment of the present invention.

In FIG. 1 and FIG. 2, an article supply device 10 of the embodiment conveys and supplies electronic components 60 that are conveyed objects in combination with a hopper 70.

The electronic components are thrown in the hopper. The electronic components are led to a first conveyance path 20 of the supply device 10 from a lower portion of the hopper. Hereinafter, when it is simply called "conveyance path", it denotes "first conveyance path" in the specification. The electronic components are aligned in line and conveyed to the downstream in the conveyance path by an air flow with their longitudinal direction being oriented in the direction of the conveyance path. The electronic components are moved to a take-out port 50 provided on the lateral side of a downstream end of the conveyance path by a movable block 30 provided at the downstream end of the conveyance path, and sucked by a pickup nozzle 80 of a mounter to be taken out.

The electronic components 60 of the embodiment has an almost rectangular parallelepiped shape. The size of the electronic components is not specifically limited. However, when the electronic components are large, influence of interference between the electronic components becomes relatively small, reducing the significance of using the supply device of the embodiment. Therefore, it is preferable that the size of the electronic components be not more than 20 mm in their long side of the almost rectangular parallelepiped shape, more preferably not more than 5 mm, and particularly preferably not more than 2 mm. Furthermore, the supply device of the embodiment can be suitably used for a multi-layer ceramic capacitor (MLCC) having a size such as 3216 size (3.2 min×1.6 mm×1.6 mm), 2012 size (2.0 mm×1.2 mm×1.2 mm), 1608 size (1.6 mm×0.8 mm×0.8 mm), 1005 size (1.0 mm×0.5 mm×0.5 mm), 0603 size (0.6 mm×0.3 mm×0.3 mm), 0402 size (0.4 mm×0.2 mm×0.2 mm), and 0201 size (0.25 mm×0.125 mm×0.125 mm) that are standard sizes. In contrast, when the electronic components are too small, processing and manufacturing of the device become difficult, it is therefore preferable that the size of the electronic components be not less than 0.05 mm in their long side and not less than 0.01 mm in their short side.

Figure 3:
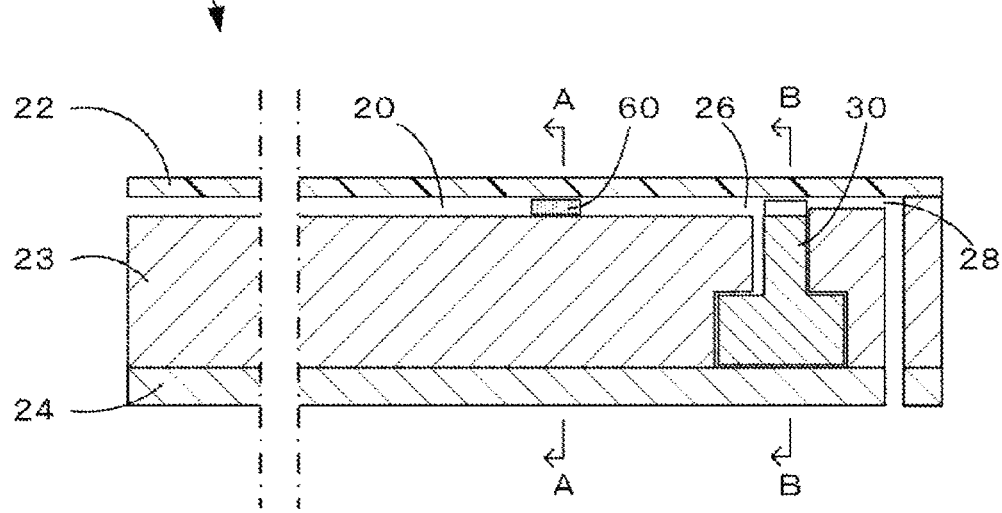
FIG. 3 is a vertical cross-sectional view along a first conveyance path of the article supply device according to the first embodiment of the present invention.
Figure 4:
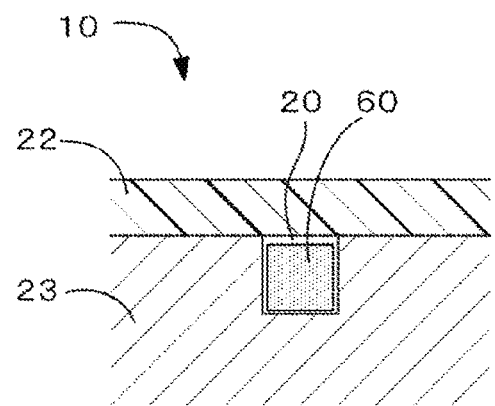
FIG. 4 is a diagram illustrating A-A cross section of FIG. 3.

In FIG. 3 and FIG. 4, the conveyance path 20 is formed in a tunnel shape by a groove formed in a base member 23 and a cover member 22 covering the upper face of the groove. The cross section of the tunnel is slightly larger than that of the electronic component 60. To convey minute components at a high speed, it is preferable to form a conveyance path of a closed system in which its side faces and upper and lower faces are regulated in this manner.

Air supply portions (27 in FIG. 6) and an air suction portion 28 are respectively provided at the upstream and the downstream of the conveyance path 20. The air supply portions supply air into the conveyance path. The air suction portion suctions the air in the conveyance path. The air suction portion 28 of the embodiment suctions the air in the conveyance path from a downstream end 26 of the conveyance path. The air supply portions and the air suction portion make it possible to generate an air flow that flows from the upstream to the downstream in the conveyance path. Note that, in order to generate the air flow, at least only one of the air supply portions at the conveyance path upstream and the air suction portion at the conveyance path downstream needs to be provided, and in this case, a vent portion may be provided at the other end. When the conveyance path is long, an air suction portion and an air supply portion may be appropriately added in midstream of the conveyance path.

Figure 5:
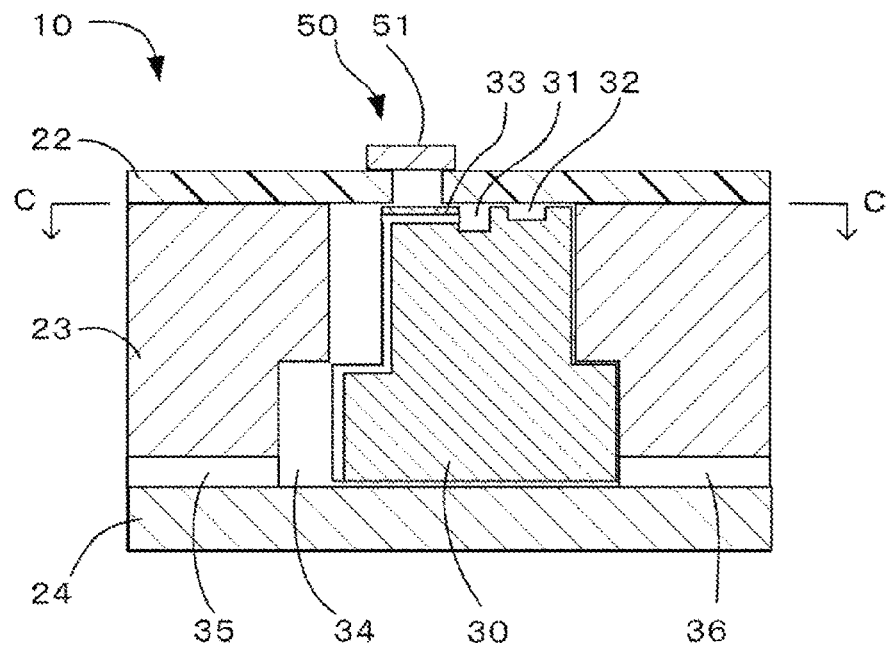
FIG. 5 is a diagram illustrating B-B cross section of FIG. 3.
Figure 6:
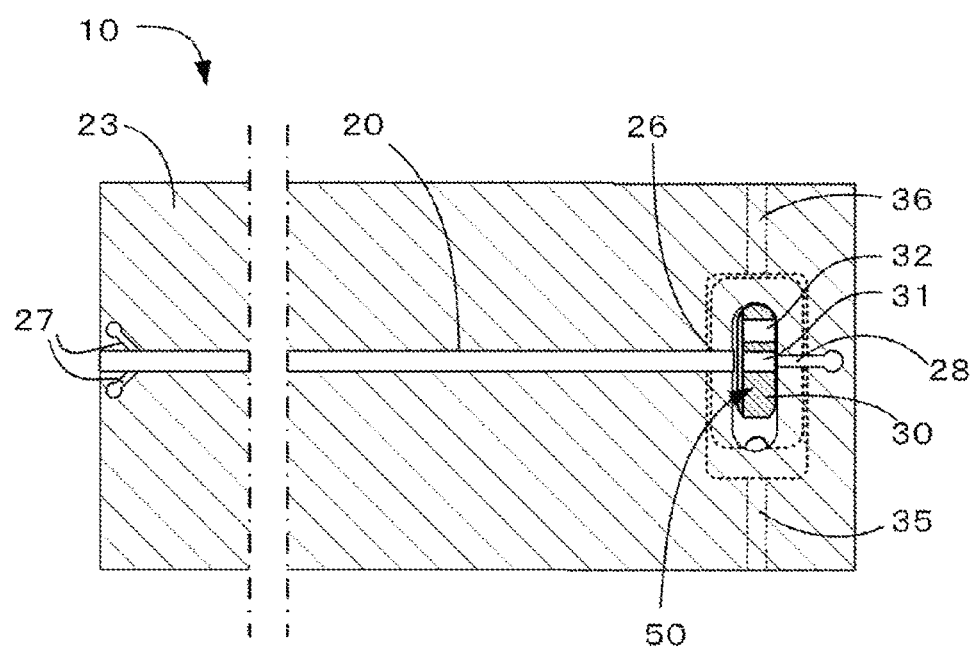
FIG. 6 is a diagram illustrating C-C cross section of FIG. 5.

In FIG. 5 and FIG. 6, the movable block 30 is disposed at the downstream end 26 of the conveyance path 20. The movable block is movable in the direction perpendicular to the conveyance path in a horizontal plane (left-right direction in FIG. 5, upper-lower direction in FIG. 6), and reciprocally movable between the downstream end of the conveyance path and the take-out port 50 provided on the lateral side of the downstream end of the conveyance path. The cover member 22 has an opening above the take-out port, and an openable and closable shatter 51 is provided at the opening. A movable area 34 of the movable block 30 is defined by a hollow space formed by the base member 23 and a bottom member 24. Pressurization/depressurization portions 35, 36 are provided at respective both ends of the movable area 34. Note that the shatter 51 is not necessarily needed, and the take-out port may be always opened.

The movable block 30 has, at an upper face, a housing portion 31 having a groove shape capable of housing one electronic component. The housing portion 31 is a housing portion of a closed system in which its both side faces and its upper and lower faces are regulated, making it possible to stably move the electronic component while preventing the electronic component in the housing portion from jumping out of the housing portion even when the movable block is driven at a high speed in the state where the electronic component 60 is housed in the housing portion 31. When the movable block is at one end in the reciprocal movement (right side in FIG. 5, upper side in FIG. 6), the housing portion serves as an extension of the conveyance path 20, making it possible to receive one electronic component that has reached the downstream end 26 of the conveyance path. Hereinafter, this state is called that the movable block or the housing portion is at receiving position.

When the movable block 30 is at the other end of the reciprocal movement (left side in FIG. 5, lower side in FIG. 6), the electronic component housed in the housing portion 31 is located at the take-out port 50, so that opening the shatter 51 on the upper portion makes it possible to take-out the electronic component by a pickup nozzle of a mounter. Hereinafter, this state is called that the movable block or the housing portion is at take-out position.

A vent portion 32 for conveyance is formed in the movable block 30 on the side opposite to the take-out port 50 with respect to the housing portion 31 at the upper face. The vent portion for conveyance only needs to have the shape that makes the downstream end 26 of the conveyance path communicate with the air suction portion 28 when the movable block is in the take-out position and that enables the electronic components that have reached the downstream end 26 of the conveyance path to be dammed.

Furthermore, the movable block 30 has a vent portion 33 for fixation at a wall surface on the take-out port side of the housing portion 31 as a positioning mechanism for the electronic component. The vent portion for fixation is communicated with a pressurization/depressurization portion 35 on the take-out port side.

Figure 7A:
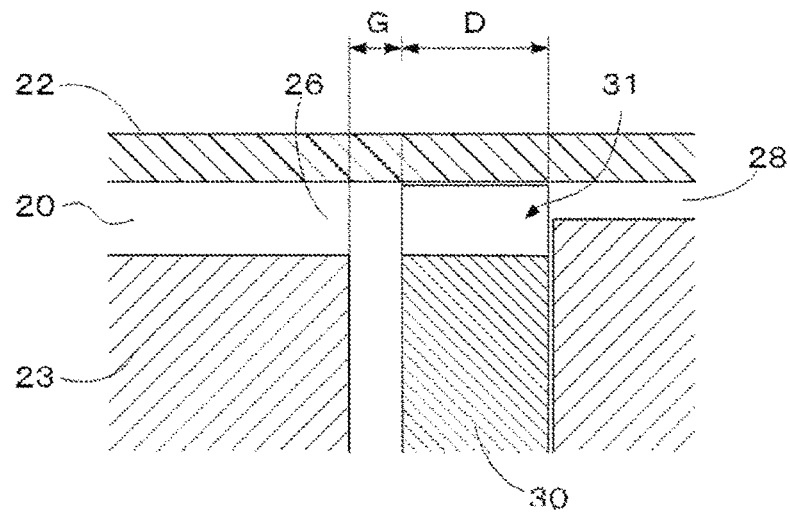
FIGS. 7A to 7C are enlarged views illustrating a housing portion of a movable block of the article supply device according to the first embodiment of the present invention.
Figure 7B:
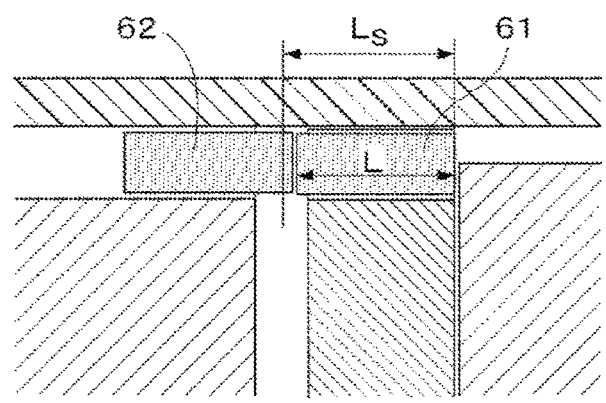
Figure 7C:
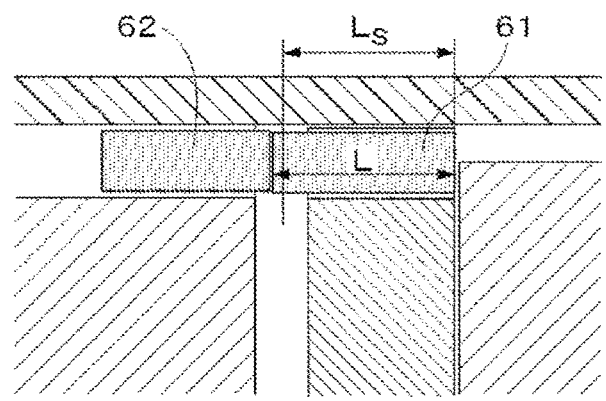

FIGS. 7A to 7C illustrate an enlarged vicinity of the housing portion 31 of the movable block 30. In FIG. 7A, when the movable block is in the receiving position, the housing portion 31 communicates with the conveyance path 20 to be an extension of the conveyance path, making it possible to receive one electronic component. The relationship between a length D of the housing portion in the conveyance direction and a standard length $L_S$ of the electronic component in the conveyance path direction is typically $D \leq L_S$. Note that when length D of the housing portion in the conveyance path direction equals standard length $L_S$ of the electronic component in the conveyance path direction, in the case where an electronic component shorter than that is mixed, an end of the subsequent electronic component enters the housing portion and interferes with the movement of the movable block to the take-out position. Therefore, it is preferable that the length D of the housing portion be shorter than the standard length $L_S$ of the electronic component in the conveyance path direction. Referencing to FIG. 7B, this prevents a leading end of the subsequent electronic component 62 from entering the housing portion even when the length L of the electronic component 61 housed in the housing portion is shorter than the standard length $L_S$, preventing the movement of the movable block from being interrupted. Specifically, it is preferable that the length D of the housing portion be not more than $L_S \times 0.99$, and more preferably not more than $L_S \times 0.95$. In contrast, when the housing portion is too short, the housed electronic component becomes instable, it is therefore preferable that length D of the housing portion be not less than $L_S \times 0.6$, and more preferably not less than $L_S \times 0.7$.

Moreover, a gap G is provided between the housing portion 31 and the downstream end 26 of the conveyance path. It is preferable that the sum D+G of the length D of the housing portion and the gap G be longer than the standard length $L_S$ of the electronic component. Referencing to FIG. 7C, this prevents the electronic component 61 from being caught at the downstream end of the conveyance path when the movable block is moved to the take-out position even when the length L of the electronic component housed in the housing portion is longer than the standard length $L_S$. Specifically, it is preferable that the sum D+G of the length D of the housing portion and the gap G be not less than $L_S \times 1.01$, and more preferably not less than $L_S \times 1.05$. In contrast, when the gap G is too large, the electronic component can be caught at the gap when the electronic component moves from the conveyance path to the housing portion, it is therefore preferable that the gap G be not more than $L_S \times 0.3$, and more preferably not less than $L_S \times 0.2$. For example, in the case where $G \leq L_S \times 0.3$, when $D = L_S \times 0.8$, $D+G \leq L_S \times 1.1$ is satisfied, and when $D = L_S \times 0.9$, $D+G \leq L_S \times 1.2$ is satisfied. For example, in actual sizes, when the standard length $L_S = 1.0$ mm, $D = 0.9$ mm and $G = 0.3$ mm are satisfied, so that $D+G = 1.2$ mm.

Next, operation of the movable block of the embodiment will be described.

Figure 8A:
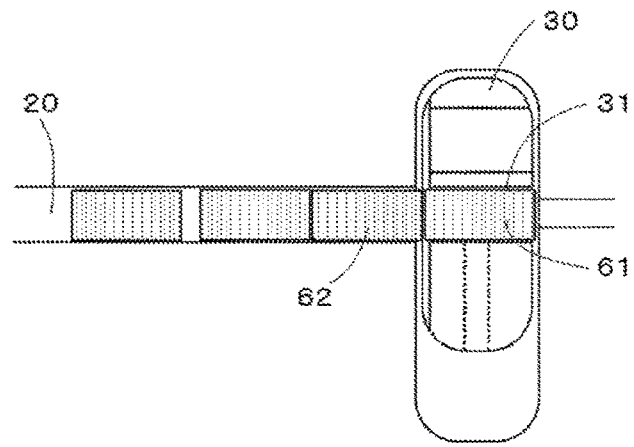
FIGS. 8A to 8C are diagrams illustrating an operation of the movable block of the article supply device according to the first embodiment of the present invention.

In FIG. 8A, the movable block 30 is in the receiving position. The electronic components are conveyed by an air flow to reach the downstream end, and the leading electronic component 61 is received by the housing portion 31 of the movable block.

Figure 8B:
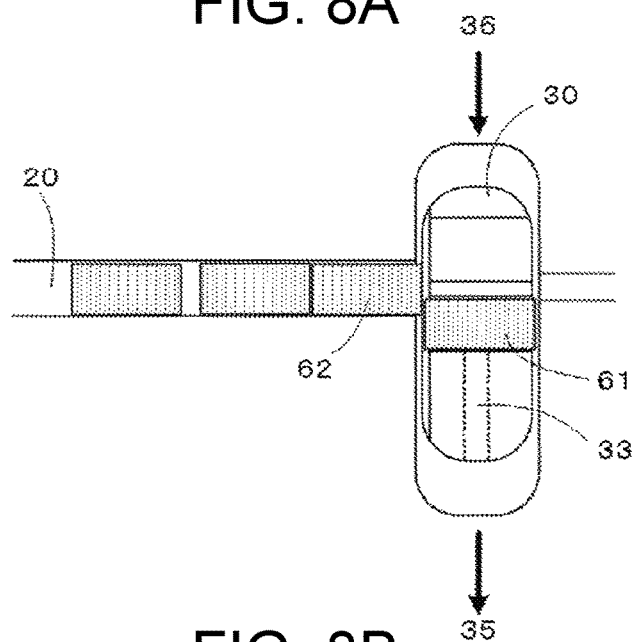

Next, in FIG. 8B, the movable block 30 moves toward the take-out position from the receiving position by suctioning the air in the movable area (34 in FIG. 5) from the pressurization/depressurization portion (35 in FIG. 5 and FIG. 6) on the take-out port side and by sending air into the movable area from the pressurization/depressurization portion (36 in FIG. 5 and FIG. 6) on the conveyance path side. In this context, since the vent portion 33 for fixation provided on the side wall surface is communicated with the pressurization/depressurization portion 35, the electronic component 61 in the housing portion is pulled to the vent portion for fixation to be fixed (positioned) to the side wall surface.

Figure 8C:
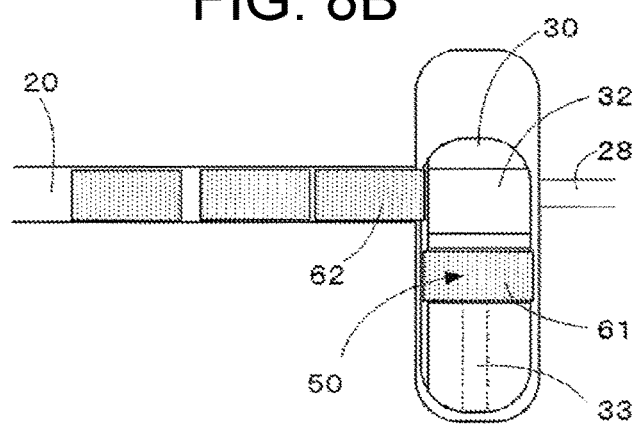

Then, in FIG. 8C, the movable block 30 reaches the take-out position. The electronic component 61 is being suctioned to the vent portion 33 for fixation. The shatter (51 in FIG. 5) on the upper portion of the take-out port 50 is opened and the electronic component 61 is taken out by the pickup nozzle of the mounter. On the other hand, the conveyance path 20 is communicated with the air suction portion 28 via the vent portion 32 for conveyance, so that the electronic components on the conveyance path continue to move toward the downstream, and the subsequent electronic components 62 are dammed by the movable block to form a line.

Then, in contrast to FIG. 8B, the movable block 30 returns to the receiving position (FIG. 8A) from the take-out position by suctioning the air in the movable area from the pressurization/depressurization portion (36 in FIG. 5 and FIG. 6) on the conveyance path side and by sending air into the movable area from the pressurization/depressurization portion (35 in FIG. 5 and FIG. 6) on the take-out port side.

Repeating the above operation to sequentially separate only the leading one electronic component (one by one) from the line of the conveyed objects that have reached the downstream end of the conveyance path makes it possible to supply the electronic components to the pickup nozzle one by one.

Hereinafter, effects of the supply device of the embodiment will be described.

As described above, in the conventional bulk feeder, the leading one electronic component is taken out in the state where the electronic components that have reached the take-out port of the downstream end of the conveyance path form a line with no gap, which could cause failure in the taking out due to interference with the subsequent electronic component. In contrast, in the supply device of the embodiment, as illustrated in FIGS. 8A to 8C, the leading one electronic component 61 among electronic components forming a line at the downstream end of the conveyance path is separated and moved to the take-out port by the movable block, preventing the leading one electronic component 61 from interfering with the subsequent electronic component 62 upon taking out the leading one electronic component 61. This makes it difficult to cause failures even when taking out pitch is made short, and makes it possible to increase the number of electronic components to be supplied per unit time. An experiment by the present inventors have succeeded in supplying the MLCCs having 1005 size to the mounter at a speed of about 20 ins per one MLCC.

Furthermore, the electronic component is fixed in the housing portion of the movable block by the operation of the vent portion 33 for fixation, making it possible to improve positional accuracy of the electronic component at the take-out port. Although the width of the housing portion 31 (length in the upper and lower direction in FIGS. 8A to 8C) is provided with a slight clearance to the size of the electronic component, positioning of the electronic component on the side wall on the take-out port side by the vent portion for fixation yields an effect of reducing positional variation of the electronic component in the housing portion to increase the success rate of picking up. This is specifically useful when the size of the electronic component is small. An experiment by the present inventors have succeeded in supplying the electronic components having 1005 size to the mounter within ±30 μm in positional accuracy.

Moreover, both of movement of the movable block and fixation of the electronic component to the vent portion for fixation are achieved by the operation of the pressurization/depressurization portions, eliminating the need of synchronization control of both of movement of the movable block and fixation of the electronic component to the vent portion for fixation, making it possible to stably perform a series of operation even when take-out pitch is made short.

An article supply device according to a second embodiment of the present invention will be described with reference to FIG. 9 to FIG. 16C.

Figure 9:
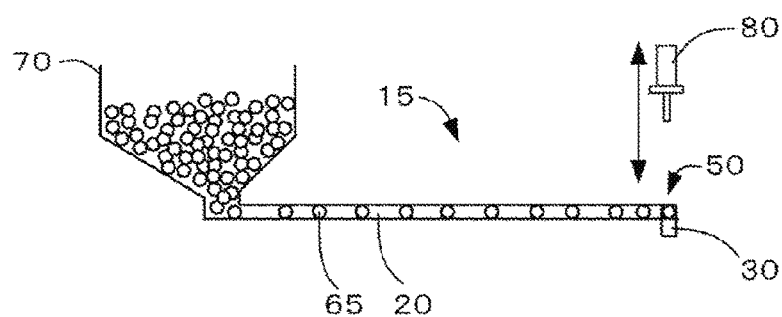
FIG. 9 is a side view illustrating a usage state of an article supply device according to a second embodiment of the present invention.
Figure 10:
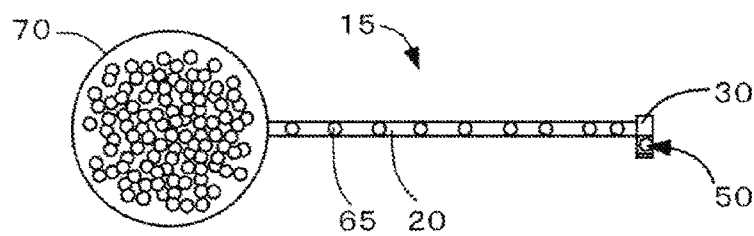
FIG. 10 is a plan view illustrating a usage state of the article supply device according to the second embodiment of the present invention.

In FIG. 9 and FIG. 10, an article supply device 15 of the embodiment conveys and supplies solder balls 65 that are conveyed objects in combination with a hopper 70. The solder balls 65 are thrown in the hopper and introduced in a first conveyance path 20 that is a conveyance portion of the supply device from a lower portion of the hopper. The solder balls are aligned in line and conveyed to the downstream by an air flow in the conveyance path. The solder balls are moved to a take-out port 50 provided on the lateral side of a downstream end of the conveyance path by a movable block 30 provided at the downstream end of the conveyance path, and sucked by a pickup nozzle 80 to be taken out.

The solder balls 65 that are conveyed objects have a spherical shape. The size of the conveyed objects is not specifically limited. However, when the conveyed objects are large, influence of interference between the conveyed objects becomes relatively small, reducing the significance of using the supply device of the embodiment. Therefore, it is preferable that the size of the conveyed objects be not more than 5 mm in their radius, more preferably not more than 2 mm, and particularly preferably not more than 1 mm. In contrast, when the conveyed objects are too small, processing and manufacturing of the device become difficult, so that it is preferable that the size of the conveyed objects is not less than 10 μm in their radius. The radius of the solder balls being used is from 100 μm to 800 μm in many cases. The supply device of the embodiment is specifically suited for conveyance and supply of solder balls having such sizes.

Figure 11:
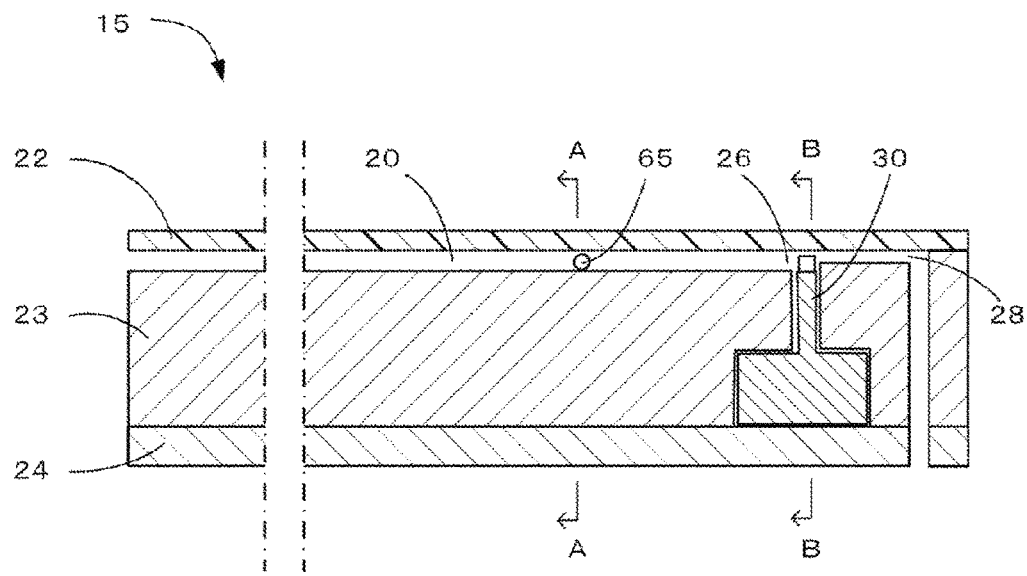
FIG. 11 is a vertical cross-sectional view along a first conveyance path of the article supply device according to the second embodiment of the present invention.
Figure 12:
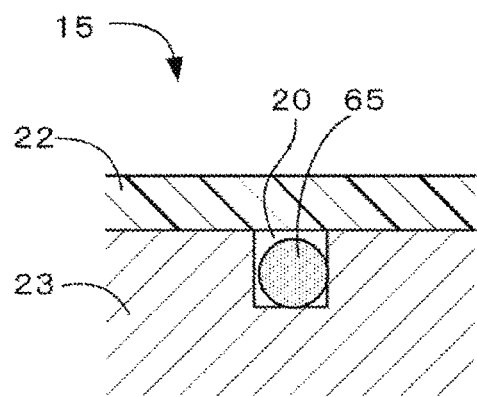
FIG. 12 is a diagram illustrating A-A cross section of FIG. 11.

In FIG. 11 and FIG. 12, the conveyance path 20 that is a conveyance portion of the embodiment is formed in a tunnel shape by a groove formed in a base member 23 and a cover member 22 covering the upper face of the groove. The cross-sectional shape of the tunnel may be a round shape or may be a rectangular shape as illustrated in FIG. 12. The size in the cross section of the tunnel is slightly larger than the solder ball 65. To convey minute articles at a high speed, it is preferable to form a conveyance path of a closed system in which its side faces and the upper and lower faces are regulated in this manner.

Air supply portions (27 in FIG. 14) and an air suction portion 28 are respectively provided at the upstream and the downstream of the conveyance path 20. The air supply portions supply air into the conveyance path. The air suction portion suctions the air in the conveyance path. The air suction portion 28 of the embodiment suctions the air in the conveyance path from a downstream end 26 of the conveyance path. The air supply portions and the air suction portion make it possible to generate an air flow that flows from the upstream to the downstream in the conveyance path. Note that, in order to generate the air flow, at least only one of the air supply portions at the conveyance path upstream and the air suction portion at the conveyance path downstream needs to be provided, and in this case, a vent portion may be provided at the other end. When the conveyance path is long, an air suction portion and an air supply portion may be appropriately added in midstream of the conveyance path.

Figure 13:
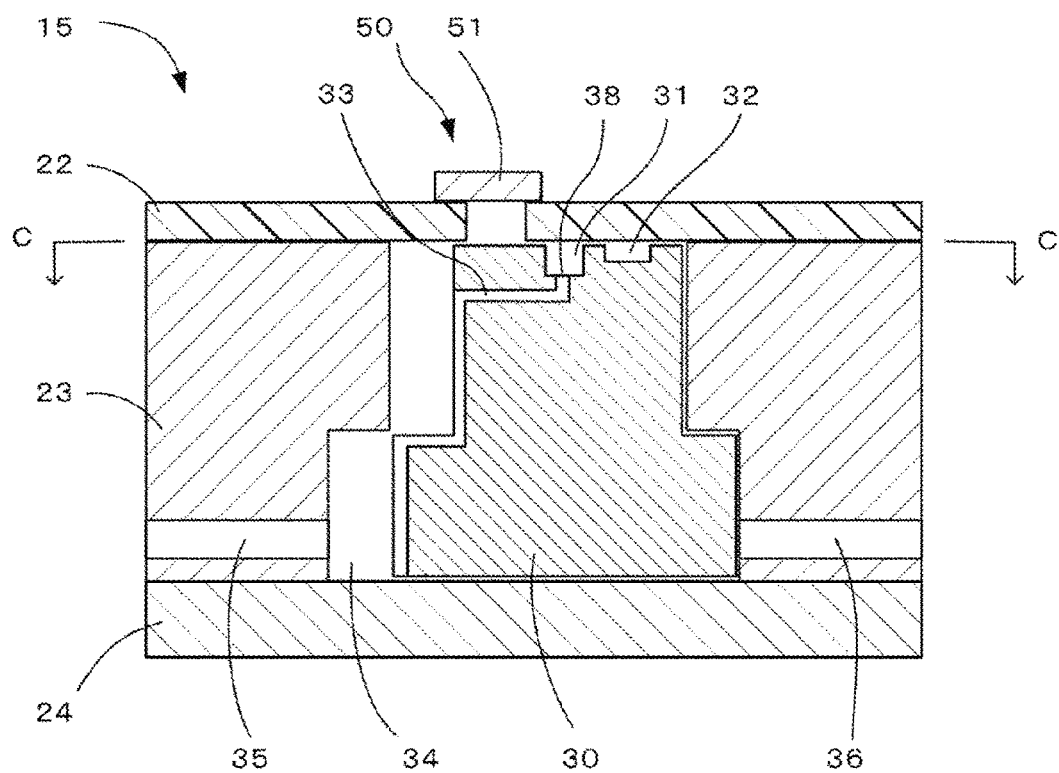
FIG. 13 is a diagram illustrating B-B cross section of FIG. 11.
Figure 14:
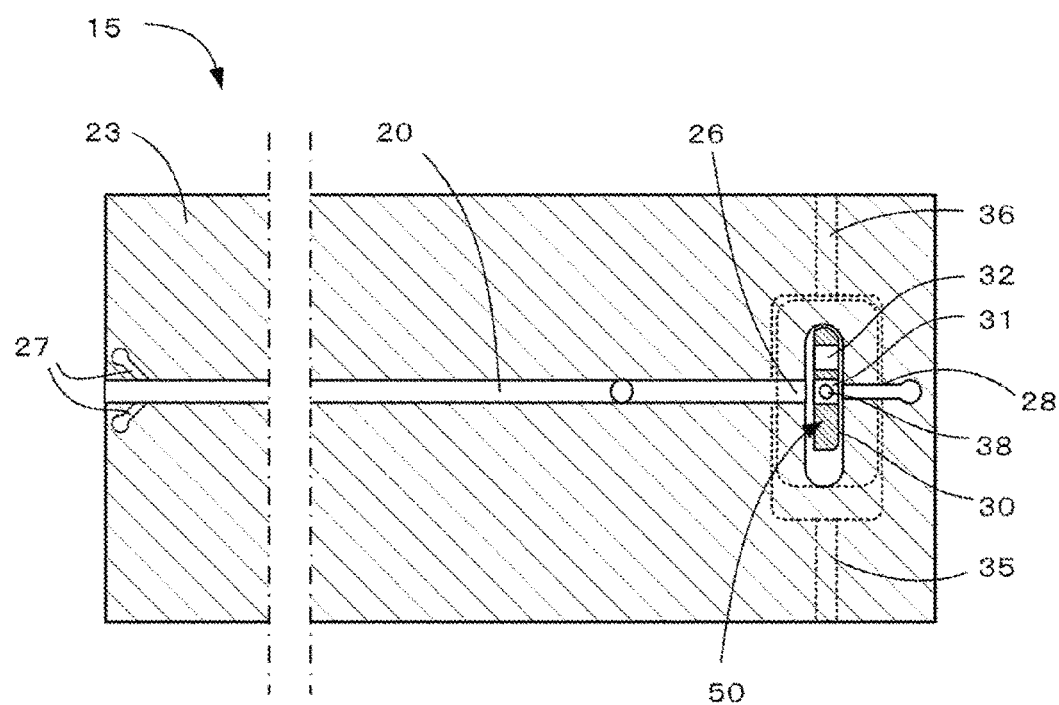
FIG. 14 is a diagram illustrating C-C cross section of FIG. 13.

In FIG. 13 and FIG. 14, the movable block 30 is disposed at the downstream end 26 of the conveyance path 20. The movable block is movable in the direction perpendicular to the conveyance path in a horizontal plane (left-right direction in FIG. 13, upper-lower direction in FIG. 14), and reciprocally movable along a straight line between the downstream end of the conveyance path and the take-out port 50 provided on the lateral side of the downstream end of the conveyance path. The cover member 22 has an opening above the take-out port, and an openable and closable shatter 51 is provided at the opening. A movable area 34 of the movable block 30 is defined by a hollow space formed by the base member 23 and a bottom member 24. Pressurization/depressurization portions 35, 36 are provided at respective both ends of the movable area 34. Note that the shatter 51 is not necessarily needed, and the take-out port may be always opened.

In this manner, it is preferable that the movable block 30 be reciprocated in a horizontal plane. This is because the movable block can be reciprocated with a smaller driving force. Furthermore, it is preferable that the movable block be reciprocated in the direction perpendicular to the conveyance path, that is, in the direction perpendicular to the receiving direction of the conveyed objects. This is because the length of the housing portion can be made short to make the movable block smaller with respect to the conveyed objects having the same size.

The movable block 30 has, at an upper face, a housing portion 31 having a groove shape capable of housing one solder ball. The housing portion 31 is a housing portion of a closed system in which its both side faces and its upper and lower faces are regulated, making it possible to stably move the solder ball while preventing the solder ball in the housing portion from jumping out of the housing portion even when the movable block is driven at a high speed in the state where the solder ball 65 is housed in the housing portion 31. When the movable block is at one end in the reciprocal movement (right side in FIG. 13, upper side in FIG. 14), the housing portion serves as an extension of the conveyance path 20, making it possible to receive one solder ball that has reached the downstream end 26 of the conveyance path. Hereinafter, this state is called that the movable block or the housing portion is at receiving position.

When the movable block 30 is at the other end of the reciprocal movement (left side in FIG. 13, lower side in FIG. 14), the solder ball housed in the housing portion 31 is located at the take-out port 50, so that opening the shatter 51 on the upper portion makes it possible to take-out the solder ball by a pickup nozzle. This state is called that the movable block or the housing portion is at take-out position.

A vent portion 32 for conveyance is formed in the movable block 30 on the side opposite to the take-out port 50 with respect to the housing portion 31 at the upper face. The vent portion for conveyance only needs to have the shape that makes the downstream end 26 of the conveyance path communicate with the air suction portion 28 when the movable block is in the take-out position and that enables the solder balls that have reached the downstream end 26 of the conveyance path to be dammed.

The movable block 30 has a vent portion 33 for fixation as a mechanism for positioning the solder ball, and an opening 38 having a round shape of the vent portion for fixation is provided on the bottom face of the housing portion 31. The vent portion for fixation is communicated with a pressurization/depressurization portion 35 on the take-out port side.

Figure 21:
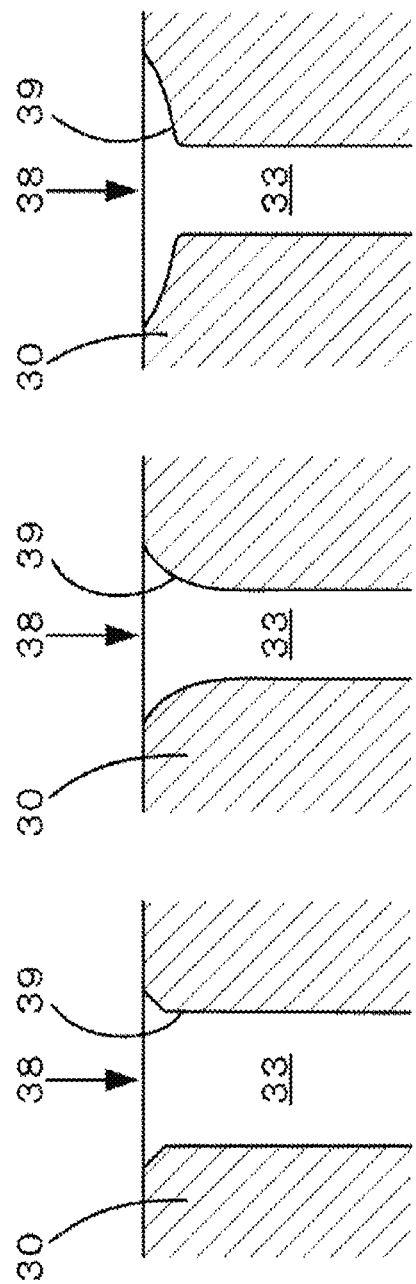
FIGS. 21A to 21C each are a diagram exemplifying a cross-sectional shape of an opening of a vent portion for fixation.

The vent portion 33 for fixation may have a radius that becomes smaller as it goes downward from the opening 38, that is, as it goes inward. FIGS. 21A to 21C each illustrates an example of the cross-sectional shape in the vicinity of the opening of the vent portion for fixation. In FIGS. 21A to 21C, an inner wall surface 39 of the vent for fixation is formed in a mortar shape or the like, and the radius of the vent portion for fixation becomes smaller as it goes downward from the opening 38. Making the opening have a mortar shape or the like in this manner makes a solder ball received in the housing portion be drawn to the opening to be fixed to the opening within a shorter period of time.

When the opening 38 of the vent portion for fixation is too large, the solder ball is fitted therein, making the resistance during pickup large. Therefore, it is preferable that the radius of the opening be not more than 0.8 times of the radius of the solder ball, and more preferably not more than 0.7 times. In contrast, when the opening is too small, a force for fixing the solder ball becomes weak, which may cause the solder ball to be unfixed from the opening when the movable block is moved. Therefore, it is preferable that the radius of the opening be not less than 0.2 times of the radius of the solder ball, and more preferably not less than 0.5 times. When the entrance of the opening is formed in a mortar shape or the like as illustrated in FIGS. 21A to 21C, and the solder ball is in contact with the inner wall surface 39 of the vent portion for fixation at a position lower than a housing portion bottom face, it is preferable that the radius of the contact circle between the solder ball and the inner wall surface 39 be not more than 0.8 times of the radius of the solder ball, more preferably not more than 0.7 times, and be not less than 0.2 times, and more preferably not less than 0.5 times.

Figure 15A:
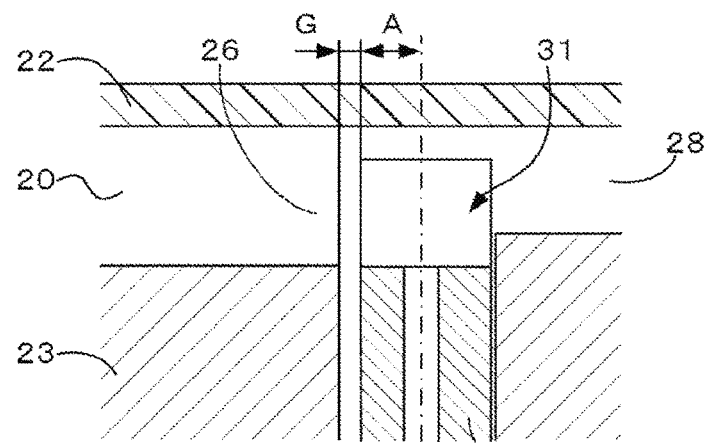
FIGS. 15A to 15C are enlarged views illustrating a housing portion of a movable block of the article supply device according to the second embodiment of the present invention.
Figure 15B:
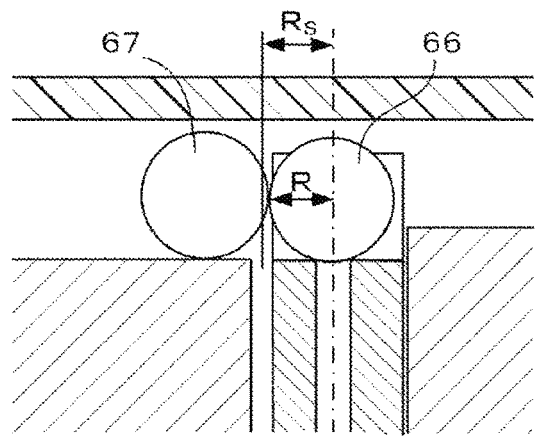
Figure 15C:
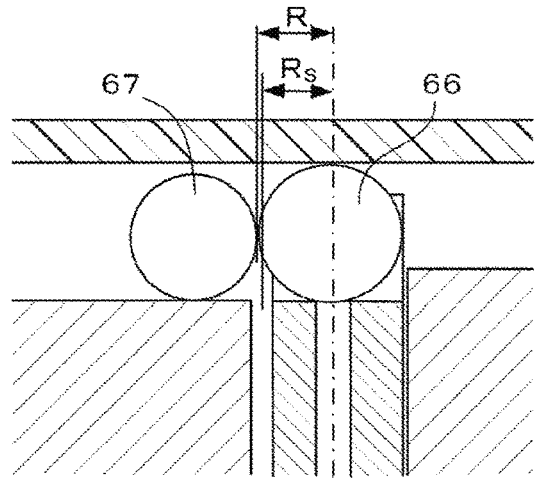

FIGS. 15A to 15C illustrate an enlarged vicinity of the housing portion 31 of the movable block 30. In FIG. 15A, when the movable block is in the receiving position, the housing portion 31 communicates with the conveyance path 20 to be an extension of the conveyance path, making it possible to receive one solder ball.

The relationship between a distance A from the center of the opening to the end on the conveyance path side of the housing portion and a standard radius $R_S$ of the solder ball typically is $A \leq R_S$. Note that when the distance A equals the standard radius $R_S$ of the semiconductor ball, in the case where a solder ball smaller than that is mixed, an end of the subsequent solder ball enters the housing portion and interferes with the movement of the movable block to the take-out position. Therefore, it is preferable that the above distance A be shorter than the standard radius $R_S$. Referring to FIG. 15B, this prevents an end of the subsequent solder ball 67 from entering the housing portion even when the radius R of the solder ball 66 housed in the housing portion is smaller than standard radius $R_S$, preventing the movement of the movable block from being interrupted. Specifically, it is preferable that the distance A be not more than $R_S \times 0.99$, and more preferably not more than $R_S \times 0.95$. In contrast, when the distance A is too short, the housed solder ball becomes instable, it is therefore preferable that the distance A be not less than $R_S \times 0.6$, and more preferably not less than $R_S \times 0.7$.

Moreover, a gap G is provided between the housing portion 31 and the downstream end 26 of the conveyance path. It is preferable that the sum A+G of the above distance A and gap G be longer than the standard radius $R_S$ of the solder ball. Referencing to FIG. 15C, this prevents the solder ball 66 from being caught at the downstream end of the conveyance path when the movable block is moved to the take-out position even when the radius R of the solder ball 66 housed in the housing portion is larger than the standard radius $R_S$. Specifically, it is preferable that the sum A+G of the distance A and the gap G be not less than $R_S \times 1.01$, and more preferably not less than $R_S \times 1.05$. In contrast, when the gap G is too large, the solder ball can be caught at the gap when the solder ball moves from the conveyance path to the housing portion, it is therefore preferable that the gap G be not more than $R_S \times 0.3$, and more preferably not more than $R_S \times 0.2$. For example, in the case where $G \leq R_S \times 0.3$, when $A = R_S \times 0.8$, $A+G \leq R_S \times 1.1$ is satisfied, and when $A = R_S \times 0.9$, $A+G \leq R_S \times 1.2$ is satisfied. In actual sizes, for example, when the standard radius $R_S = 750$ µm, $A \approx 675$ µm and $G = 225$ µm are satisfied, so that $A+G = 900$ µm.

Next, operation of the movable block of the embodiment will be described.

Figure 16A:
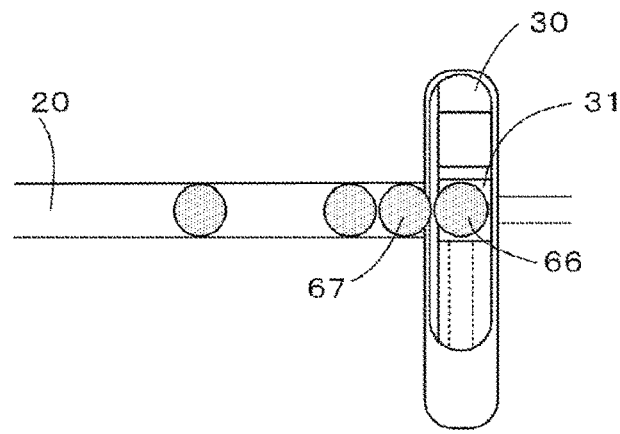
FIGS. 16A to 16C are diagrams illustrating an operation of the movable block of the article supply device according to the second embodiment of the present invention.

In FIG. 16A, the movable block 30 is in the receiving position. The solder balls are conveyed by an air flow to reach the downstream end, and the leading solder ball 66 is received by the housing portion 31 of the movable block.

Figure 16B:
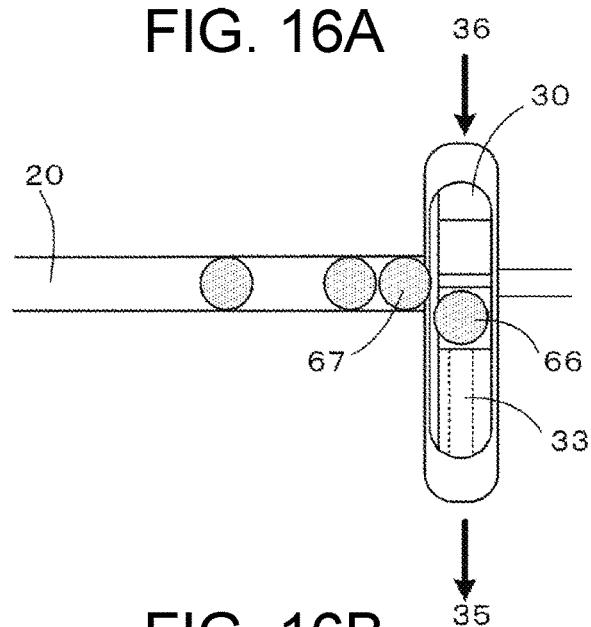

Next, in FIG. 16B, the movable block 30 moves toward the take-out position from the receiving position by suctioning the air in the movable area (34 in FIG. 13) from the pressurization/depressurization portion (35 in FIG. 13 and FIG. 14) on the take-out port side and by sending air into the movable area from the pressurization/depressurization portion (36 in FIG. 13 and FIG. 14) on the conveyance path side. In this context, since the vent portion 33 for fixation is communicated with the pressurization/depressurization portion 35, the solder ball 66 in the housing portion is withdrawn to the opening (38 in FIG. 13 and FIG. 14) of the vent portion for fixation to be fixed (positioned) to the bottom face of the housing portion.

Figure 16C:
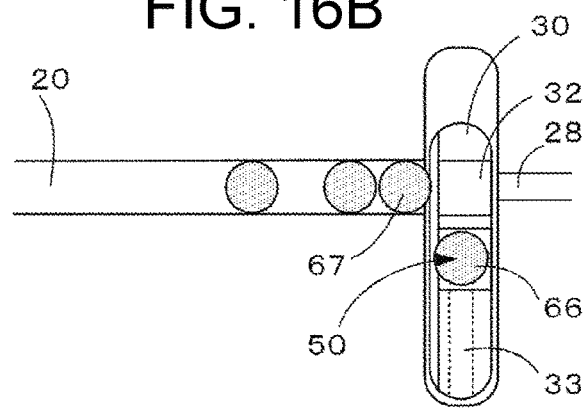

Then, in FIG. 16C, the movable block 30 reaches the take-out position. The solder ball 66 is being suctioned to the opening of the vent portion for fixation. The shatter (51 in FIG. 13) on the upper portion of the take-out port 50 is opened and the solder ball 66 is taken out by the pickup nozzle. On the other hand, the conveyance path 20 is communicated with the air suction portion 28 via the vent portion 32 for conveyance, so that the solder balls on the conveyance path continue to move toward the downstream, and the subsequent solder balls 67 are dammed by the movable block to form a line.

Then, in contrast to FIG. 16B, the movable block 30 returns to the receiving position (FIG. 16A) from the take-out position by suctioning the air in the movable area from the pressurization/depressurization portion (36 in FIG. 13 and FIG. 14) on the conveyance path side and by sending air into the movable area from the pressurization/depressurization portion (35 in FIG. 13 and FIG. 14) on the take-out port side.

Repeating the above operation to sequentially separate only the leading one solder ball (one by one) from the line of the solder bolls that have reached the downstream end of the conveyance path makes it possible to supply the solder balls to the pickup nozzle one by one.

Hereinafter, effects of the embodiment will be described.

In the article supply device of the embodiment, as illustrated in FIGS. 16A to 16C, the leading one solder ball 66 among solder balls forming a line at the downstream end of the conveyance path is separated and moved to the take-out port by the movable block, preventing the leading one solder ball 66 from interfering with the subsequent solder ball 67 upon taking out the leading one solder ball 66. This makes it difficult to cause failures even when taking out pitch is made short, and makes it possible to increase the number of solder balls to be supplied per unit time.

Figure 22:
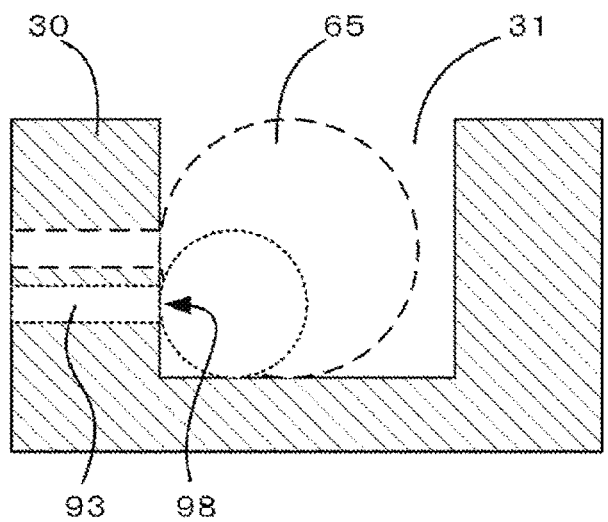
FIG. 22 is a diagram illustrating a comparative example in which an opening of a vent portion for fixation is provided in a side wall surface of a housing portion.

Furthermore, the solder ball is fixed to the housing portion bottom face by the operation of the vent portion 33 for fixation, preventing the solder ball from being nipped between the movable block and an end or the like of the conveyance portion when the movable block moves. Note that, with reference to FIG. 22, in the case where the conveyed object is a spherical shape or the like, when an opening 98 of a vent portion 93 for fixation is provided at a housing portion side wall surface, the position of the opening 98 (the height from the bottom face) needs to be changed when the size of the conveyed object 65 is varied even a little. In contrast, in the embodiment, the position of the opening 38 needs no change even when the size of the conveyed object having a spherical shape or the like is changed in some degree by providing the opening 38 of the vent portion for fixation at the housing portion bottom face.

Furthermore, although the width of the housing portion 31 (length in the upper and lower direction in FIGS. 16A to 16C) is provided with a slight clearance to the size of the solder ball, positioning of the solder ball on the bottom face of the housing portion by the vent portion for fixation yields an effect of reducing positional variation of the solder ball in the housing portion to increase the success rate of picking up. This is particularly beneficial when the size of the solder ball is small.

Moreover, both of movement of the movable block and fixation of the solder ball to the vent portion for fixation are achieved by the operation of the pressurization/depressurization portions, eliminating the need of synchronization control of both of movement of the movable block and fixation of the solder ball to the vent portion for fixation, making it possible to stably perform a series of operation even when take-out pitch is made short. An experiment by the present inventors have succeeded in stably reciprocating the movable block at a cycle of 20 ms using solder balls having a diameter of 760 μm.

Next, a third embodiment of the article supply device of the present invention will be described with reference to FIG. 17 and FIG. 18.

Figure 17:
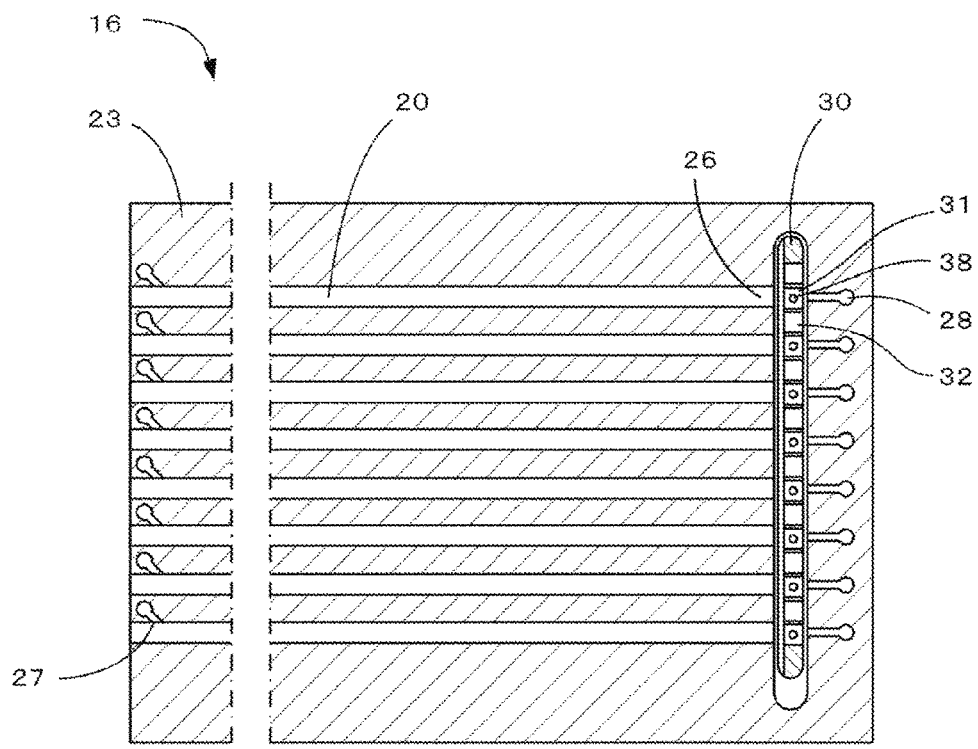
FIG. 17 is a horizontal cross-sectional view along first conveyance paths of an article supply device according to a third embodiment of the present invention.
Figure 18:
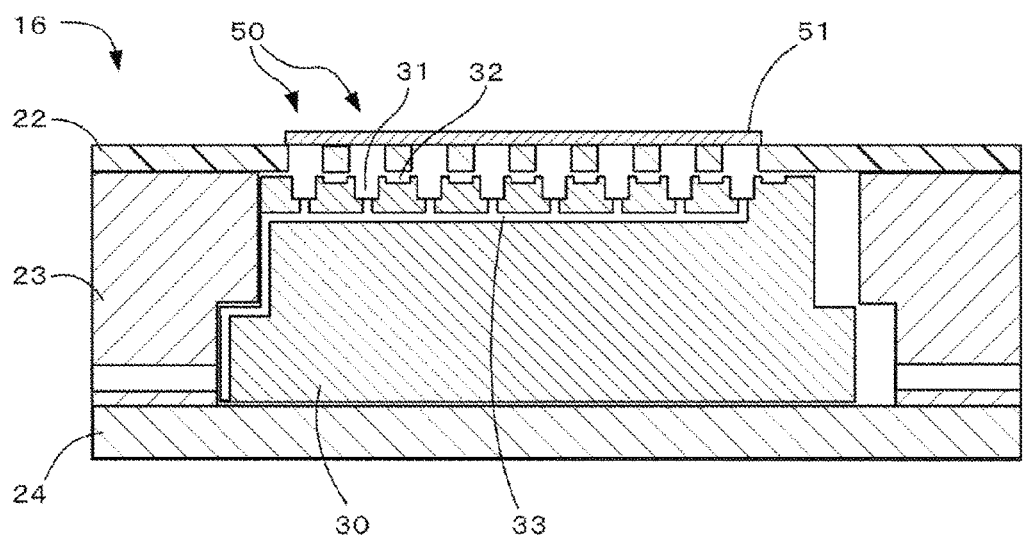
FIG. 18 is a vertical cross-sectional view of a movable block portion of the article supply device according to the third embodiment of the present invention.

In FIG. 17 and FIG. 18, an article supply device 16 of the embodiment differs from that of the second embodiment in that a plurality of first conveyance paths 20 is provided in parallel. In a movable block 30, a plurality of housing portions 31 is formed capable of receiving conveyed objects one by one from the downstream ends 26 of respective the plurality of first conveyance paths 20. A take-out port 50 is provided above each of the housing portions when the movable block is in the take-out position.

The structure and function of the other portions are same as those of the portions to which the same reference numerals are used in FIG. 13 and FIG. 14 in the second embodiment. Furthermore, the effect of separating conveyed objects one by one from the leading one in each conveyance path by the movable block, and the effect of fixing the conveyed object in each housing portion by a vent portion for fixation are same as those in the first embodiment.

Next, a fourth embodiment of the article supply device of the present invention will be described with reference to FIG. 19.

Figure 19:
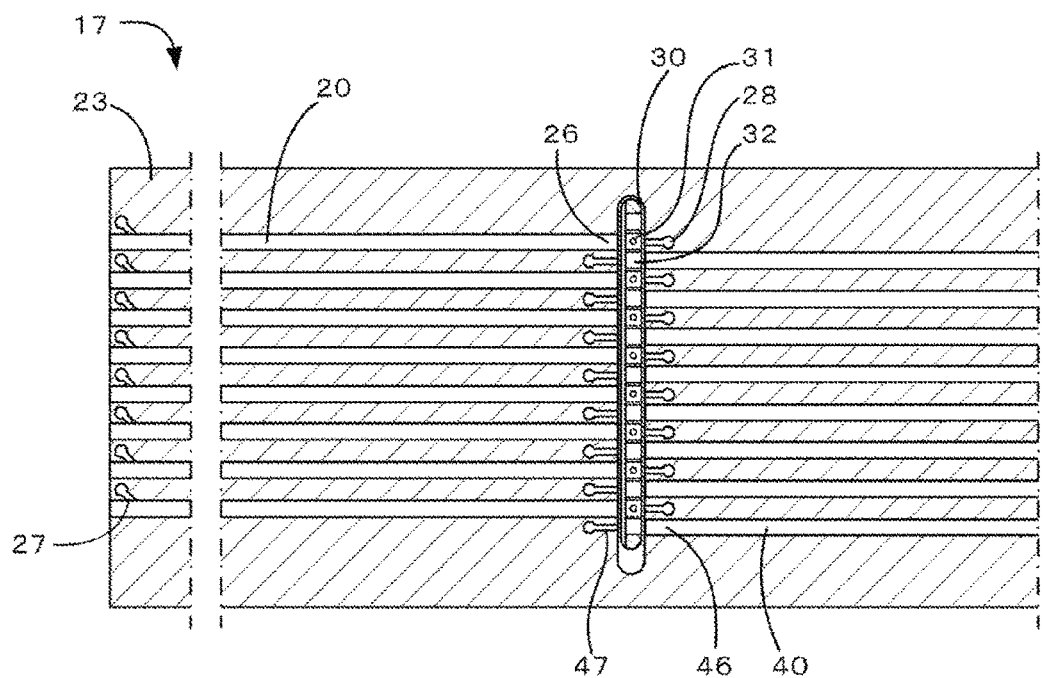
FIG. 19 is a horizontal cross-sectional view along conveyance paths of an article supply device according to a fourth embodiment of the present invention.

In FIG. 19, an article supply device 17 of the embodiment is provided with a plurality of first conveyance paths 20 in parallel like the second embodiment. The embodiment differs from the third embodiment in that no take-out ports exist above a movable block 30 and conveyed objects are further dispensed in respective second conveyance paths from the movable block.

Second conveyance paths 40 are provided in parallel by the same number and at the same intervals as those of the first conveyance paths on the side opposite to the first conveyance paths 20 with respect to the movable block 30. Furthermore, the second conveyance paths are staggered in the width direction of the first conveyance paths such that an extension to the upstream side of each of the second conveyance paths is located between corresponding two of the first conveyance paths.

The movable block 30 receives conveyed objects in housing portions 31 from downstream ends 26 of the first conveyance paths at a receiving position. Then, the movable block dispenses, at the other end of reciprocal movement, the conveyed objects in the housing portions to upstream ends 46 of the second conveyance paths. This state is called that the movable block or the housing portions is or are at dispensing position. The conveyed objects are further conveyed to the downstream through the second conveyance paths.

The structure and the function of the other portions are similar to those of the other portions in the third embodiment. Furthermore, the effect of separating conveyed objects from the leading one in each conveyance path by the movable block, and the effect of fixing the conveyed object in each housing portion by a vent portion for fixation are same as those in the second and third embodiments.

According to the article supply device 17 of the embodiment, the conveyed objects that have been conveyed through the first conveyance paths arranged in parallel are once housed in the movable block, and then concurrently introduced in the second conveyance paths. In this manner, the conveyed objects can be supplied to the next process with synchronization by the movable block.

Next, a fifth embodiment of the article supply device of the present invention will be described with reference to FIG. 20.

Figure 20:
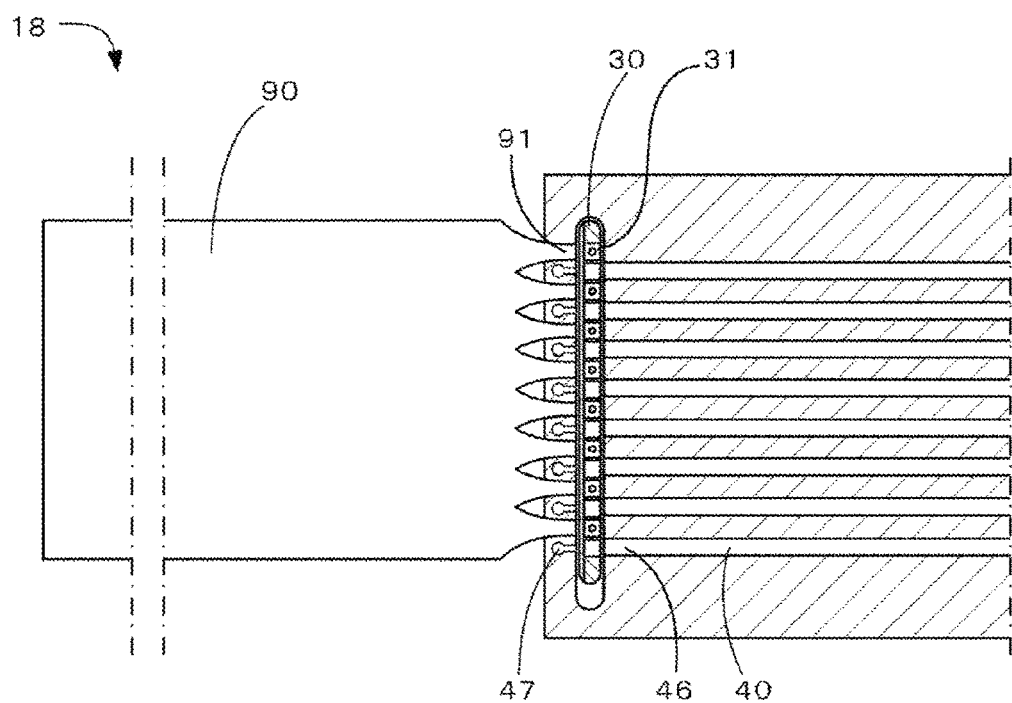
FIG. 20 is a plan view (left side) and a horizontal cross-sectional view (right side) along second conveyance paths of an article supply device according to a fifth embodiment of the present invention.

In FIG. 20, an article supply device 18 of the embodiment differs from that of the forth embodiment in having a vibration feeder 90 as the conveyance portion instead of the first conveyance paths.

Conveyed objects are thrown on the vibration feeder 90, and conveyed toward a movable block. The movable block 30 receives the conveyed objects in respective housing portions 31 one by one from outlet ports 91 of the vibration feeder in the receiving position.

The structure and the function of the other portions are like those of the other portions in the third and fourth embodiments. Furthermore, the effect of separating one conveyed object from each outlet port of the vibration feeder by the movable block and the effect of fixing the conveyed object in each housing portion by a vent portion for fixation are same as those in the second to fourth embodiments.

The present invention is not limited to the above embodiments, and various modifications can be made within the scope of its technical idea.

For example, in the first embodiment, the conveyed objects are not limited to the electronic components. Furthermore, in the first embodiment, the shape of the conveyed object is not limited to an almost rectangular parallelepiped, and only needs to be the shape allowing conveyance by an air flow by designing the cross-sectional shape of the conveyance path to match the conveyed object.

Furthermore, for example, in the second to fifth embodiments, the conveyed objects are not limited to solder balls, and may be other articles such as balls for minute bearing, and spacers for liquid crystal display panel. Furthermore, the shape of the conveyed objects is not limited to a spherical shape, and the article supply devices according to the second to fifth embodiments can be suitably used for minute articles having the shape in which their lower surface is convex such as spheroids. Note that, when the conveyed object is not a spherical shape, the above distance A and gap G can be determined as suitable vales with respect to the maximum radius R' of the conveyed object in the direction parallel to the housing portion bottom face.

Furthermore, for example, a conveying mechanism for conveying conveyed objects may be one that conveys conveyed objects by magnet or vibration. Furthermore, in the above second embodiment, the conveyed objects are conveyed by an air flow, but the conveyance path may be inclined to convey the conveyed objects by gravitational force.

Figure 23:
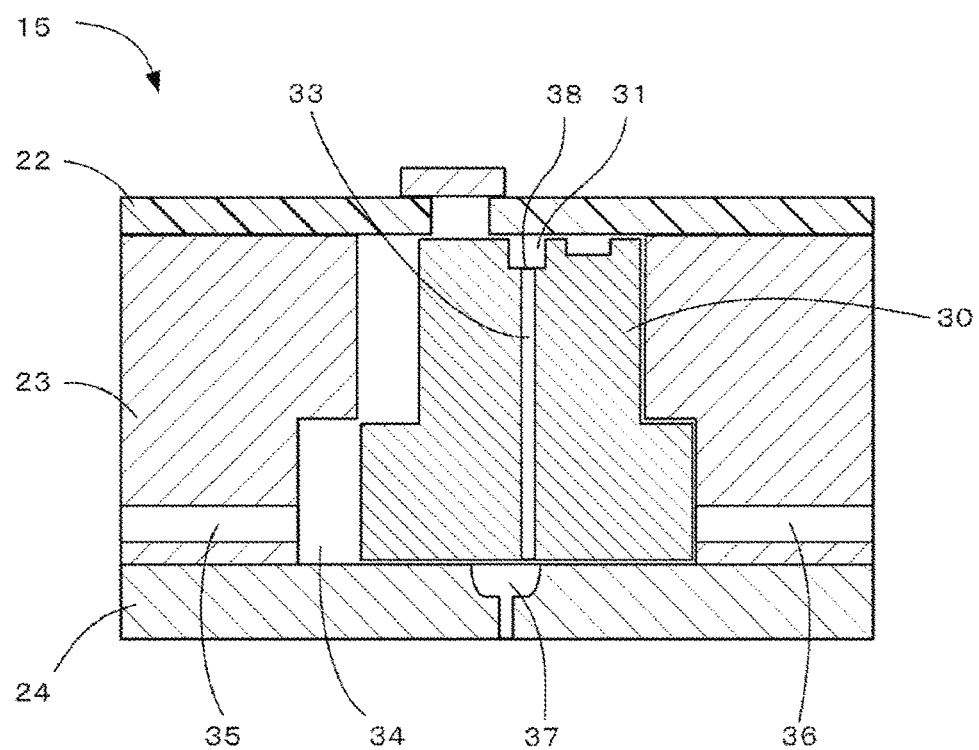
FIG. 23 is a diagram illustrating a variation of the vent portion for fixation.

Furthermore, for example, the positioning mechanism for positioning the conveyed object housed in the housing portion of the movable block on the side wall surface or the bottom face of the housing portion may be one that sucks the conveyed object to the side wall surface or the bottom face by a magnet. Furthermore, in the above embodiments, although the vent portion for fixation is communicated with the pressurization/depressurization portion on the dispensing or take-out position side, the vent portion for fixation may be communicated with an independent depressurization portion. As such an example, in FIG. 23, a depressurization portion 37 for fixation is provided at the bottom member 24 and the vent portion 33 for fixation extending downward from the bottom face of the housing portion 31 is made to communicate with the depressurization portion for fixation.

The invention claimed is:

1. An article supply device having:
a conveyance portion for conveying conveyed objects;
a movable block; and
a pressurization/depressurization portion at each end of a movable area of the movable block, wherein
the pressurization/depressurization portion located at one end of the movable area performs suctioning air while the pressurization/depressurization portion located at the other end of the movable area performs sending air so as to cause a pressure difference in the movable area; and
the movable block comprises a housing portion capable of housing one of the conveyed objects at a receiving position in which the housing portion communicates with a downstream end of the conveyance portion;
the movable block is capable of a reciprocal movement in a direction intersecting a receiving direction of the conveyed objects by a pressure difference caused by the pressurization/depressurization portions;
the housing portion is in the receiving position at one end of the reciprocal movement, and the housing portion is in a dispensing position or a take-out position in which the conveyed objects are dispensed or taken out at another end of the reciprocal movement; and
the movable block further comprises a positioning mechanism within the housing portion in which the positioning mechanism positions the conveyed object housed in the housing portion, and the positioning mechanism is a vent portion for fixation communicating with one of the pressurization/depressurization portions on a side of the dispensing position or the take-out position.

2. The article supply device according to claim 1, wherein the positioning mechanism positions the conveyed objects on a side wall surface of the housing portion.

3. The article supply device according to claim 2, wherein the positioning mechanism is a vent portion for fixation communicating with a depressurization portion, and an opening is disposed on the side wall surface of the housing portion.

4. The article supply device according to claim 1, wherein
the movable block further has a positioning mechanism for positioning the conveyed objects housed in the housing portion on a side wall surface of the housing portion, and
the positioning mechanism is a vent portion for fixation communicating with one of the pressurization/depressurization portions on a side of the dispensing position or the take-out position, and an opening is disposed on the side wall surface of the housing portion on a side of the dispensing position or the take-out position.

5. The article supply device according to claim 2, wherein a sum (D+G) of a length (D) of the housing portion in a conveying direction of the conveyed objects and a gap (G) between the housing portion and the downstream end of the conveyance portion is longer than a standard length ($L_S$) of the conveyed objects in the conveying direction.

6. The article supply device according to claim 1, wherein an opening is disposed on a bottom face of the housing portion.

7. The article supply device according to claim 6, wherein the opening has a round shape.

8. The article supply device according to claim 7, wherein the vent portion for fixation has a radius that becomes smaller as the vent portion goes inward from the opening in a vicinity of the opening.

9. The article supply device according to claim 1, wherein the conveyance portion is a first conveyance path extending in a one-dimensional direction.

10. The article supply device according to claim 1, wherein the article supply device further has a take-out port that enables the conveyed objects in the housing to be taken out when the movable block is at another end of the reciprocal movement and the housing portion is in the take-out position.

11. The article supply device according to claim 1, wherein the article supply device further has a second conveyance path provided on a side opposite to the conveyance portion with respect to the movable block and extending in a one-dimensional direction, and
the conveyed objects in the housing portion are dispensed on an upstream end of the second conveyance path when the movable block is at another end of the reciprocal movement and the housing portion is in the dispensing position.

* * * * *